United States Patent
Yin

(10) Patent No.: US 10,938,345 B2
(45) Date of Patent: Mar. 2, 2021

(54) GM-BOOSTED DIFFERENTIAL VOLTAGE-CONTROLLED OSCILLATOR (VCO)

(71) Applicant: NXP USA, INC., Austin, TX (US)

(72) Inventor: Yi Yin, Munich (DE)

(73) Assignee: NXP USA, INC., Austin, TX (US)

(*) Notice: Subject to any disclaimer, the term of this patent is extended or adjusted under 35 U.S.C. 154(b) by 0 days.

(21) Appl. No.: 16/451,589

(22) Filed: Jun. 25, 2019

(65) Prior Publication Data

US 2019/0393837 A1 Dec. 26, 2019

(30) Foreign Application Priority Data

Jun. 26, 2018 (EP) .................................... 18179888

(51) Int. Cl.
  *H03B 5/12* (2006.01)
  *H03B 5/18* (2006.01)
  *H03K 3/354* (2006.01)

(52) U.S. Cl.
  CPC ........... *H03B 5/124* (2013.01); *H03B 5/1228* (2013.01); *H03B 5/1231* (2013.01); *H03B 2200/004* (2013.01)

(58) Field of Classification Search
  CPC .................. H03B 5/124; H03B 5/1231; H03B 2200/004; H03B 5/1215; H03B 5/1296; H03B 5/1243; H03B 5/1228
  USPC .............................. 331/117 R, 117 FE, 167
  See application file for complete search history.

(56) References Cited

U.S. PATENT DOCUMENTS

| 3,134,948 A | 5/1964 | Wilting |
| 6,356,602 B1* | 3/2002 | Rodal ..................... G01S 19/36 375/344 |
| 7,414,481 B2 | 8/2008 | Li et al. |
| 8,736,392 B2* | 5/2014 | Taghivand ........... H03B 5/1212 331/167 |
| 9,197,221 B2 | 11/2015 | Babaie et al. |
| 2006/0181355 A1 | 8/2006 | Copani et al. |
| 2010/0207695 A1* | 8/2010 | Bao ..................... H03B 5/1218 331/117 FE |
| 2011/0169581 A1 | 7/2011 | Chung |
| 2013/0141175 A1 | 6/2013 | Yin et al. |
| 2014/0203881 A1 | 7/2014 | Lu et al. |
| 2017/0324378 A1* | 11/2017 | Shahmohammadi ....................... H03B 5/1262 |
| 2017/0331430 A1* | 11/2017 | Anand ................ H03B 5/1228 |

(Continued)

OTHER PUBLICATIONS

Hajimiri, A., "A General Theory of Phase Noise in Electrical Oscillators", IEEE Journal of Solid-State Circuits, vol. 33, No. 2, Feb. 1998.

(Continued)

*Primary Examiner* — Richard Tan

(57) ABSTRACT

The present application relates to a differential Colpitts voltage-controlled oscillator (VCO) circuit, which comprises a pair of transistors with control terminals biased by a common biasing voltage and a pair of couplers arranged to cross-couple corrector/drain of the transistors and the base/gate of the differential transistors. The pair of couplers have a coupling factor $k_c$, which used to enhance the transconductance of the transistor pair, therefore can be used for power consumption reduction and phase noise minimalization.

18 Claims, 5 Drawing Sheets

(56) References Cited

U.S. PATENT DOCUMENTS

2018/0109225 A1   4/2018   Jin et al.
2018/0131323 A1*  5/2018   Shu ..................... H03B 5/1212

OTHER PUBLICATIONS

Kim, C., "A K-Band Quadrature VCO Based on Asymmetric Coupled Transmission Lines", IEEE 2008.
Li, X., "Gm-Boosted Common-Gate LNA and Differential Colpitts VCO/QVCO in 0.18-um CMOS", IEEE Journal of Solid-State Circuits, vol. 40, No. 12, Dec. 2005.
Padovan, F., "A K-band SiGe Bipolar VCO with Transformer-Coupled Varactor for Backhaul Links", IEEE 2013.
Song, T., "A 5Ghz Transformer-Coupled CMOS VCO Using Bias-Level Shifting Technique", 2004 IEEE Radio Frequency Integrated Circuits Symposium, IEEE 2004.

* cited by examiner

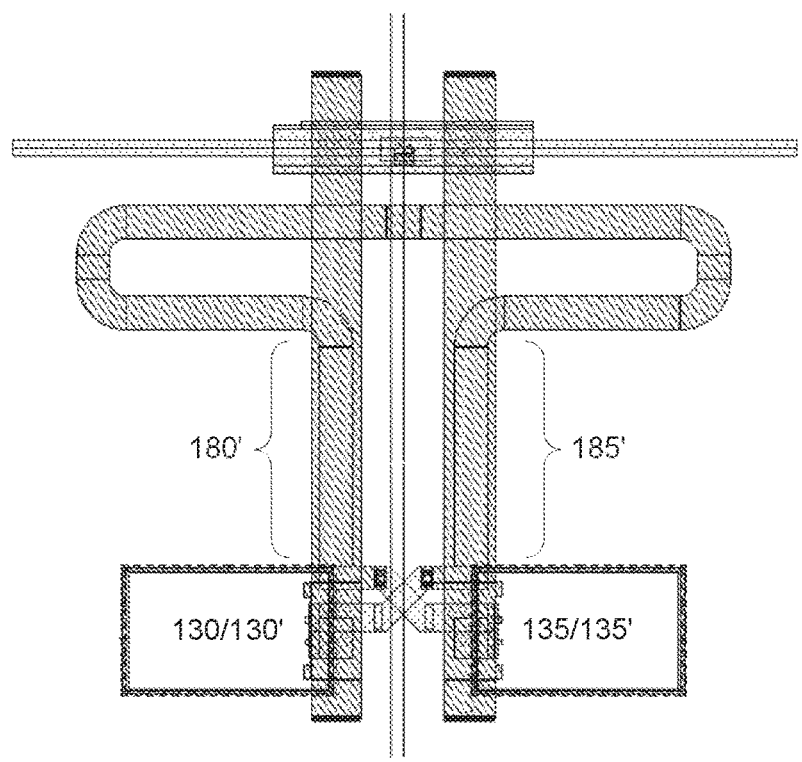
FIG. 5a
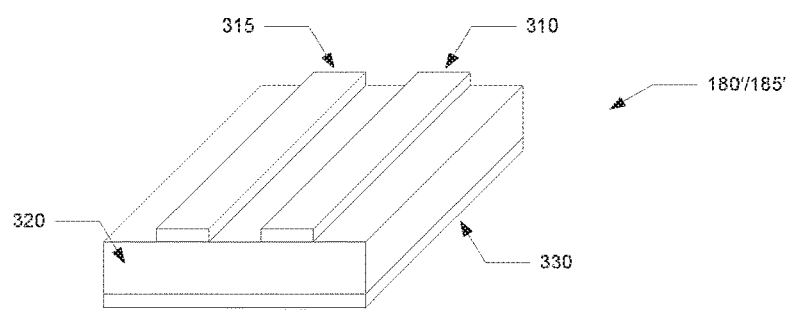
FIG. 5b
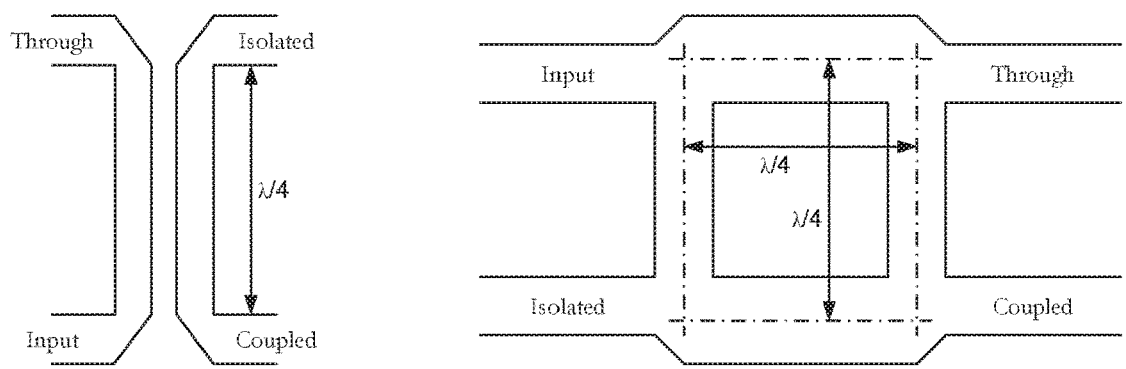
FIG. 5c
FIG. 5d

US 10,938,345 B2

GM-BOOSTED DIFFERENTIAL VOLTAGE-CONTROLLED OSCILLATOR (VCO)

CROSS-REFERENCE TO RELATED APPLICATIONS

This application claims the priority under 35 U.S.C. § 119 of European Patent application no. 18179888.5, filed on 26 Jun. 2018, the contents of which are incorporated by reference herein.

FIELD OF THE INVENTION

The present disclosure relates generally to a differential voltage-controlled (VCO) oscillator. In particular, the present disclosure relates to an Gm-boosted (transconductance-boosted) differential VCO with Colpitts configuration.

BACKGROUND

The development of millimeter-wave silicon technology has been driven in the last years by automotive driver assistance systems (ADASs) for safety and security, high throughput short-range wireless communication and non-destructive scanning systems. For instance, ADASs make use of ultra-wideband (UWB)/frequency-modulated continuous-wave (FMCW) radar circuits in the W-band (75 GHz to 110 GHz). A complete ADAS equipment typically includes 77-81 GHz short-range radar (SRR) UWB sensors aiming at parking aid, blind-spots detection, and collision mitigation assistance and 76-77 GHz long-range radar (LRR) sensors with FMCW modulation aiming at front-monitoring and adaptive cruise control (ACC). The 57 GHz to 64 GHz band is currently under investigation for Wireless Personal Area Network (WPAN) communications at IEEE (802.15.TG3c) with data rate of 1 Gbps and above. Wireless communication is also under study in the Terahertz region, specifically in a frequency range of 300 GHz to 3 THz. Furthermore, Terahertz time-domain spectroscopy using pulse waves are applied for security inspections.

Frequency synthesizer adopted in such systems should provide a clock reference with a wide frequency range, whereas spectral purity and large output power toward the power amplifier (PA) are also a desire. In a voltage-controlled oscillator (VCO)-based frequency synthesizer, the power and in-band noise performance rely on the VCO circuit, which represents a crucial block of the frequency synthesizer together with high-frequency dividers (i.e., prescaler). Despite of the past development, the implementation of a millimeter-wave VCO with low phase noise (PN) and wide tuning range (TR) In combination with a high output power oscillation signal is still challenging.

Prior art VCO with Colpitts configuration have been demonstrated to partly fulfil the above requirements but significantly suffers from poor start-up characteristics, which means that a high power consumption has to be accepted to ensure reliable start-up.

SUMMARY

The present invention provides a differential voltage-controlled oscillator circuit as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

FIGS. 5a to 5d schematically illustrate layouts of exemplary transmission line based couplers applicable with the above embodied Gm-boosted differential Colpitts VCOs according to examples of the present invention.

DETAILED DESCRIPTION

Figure 1:
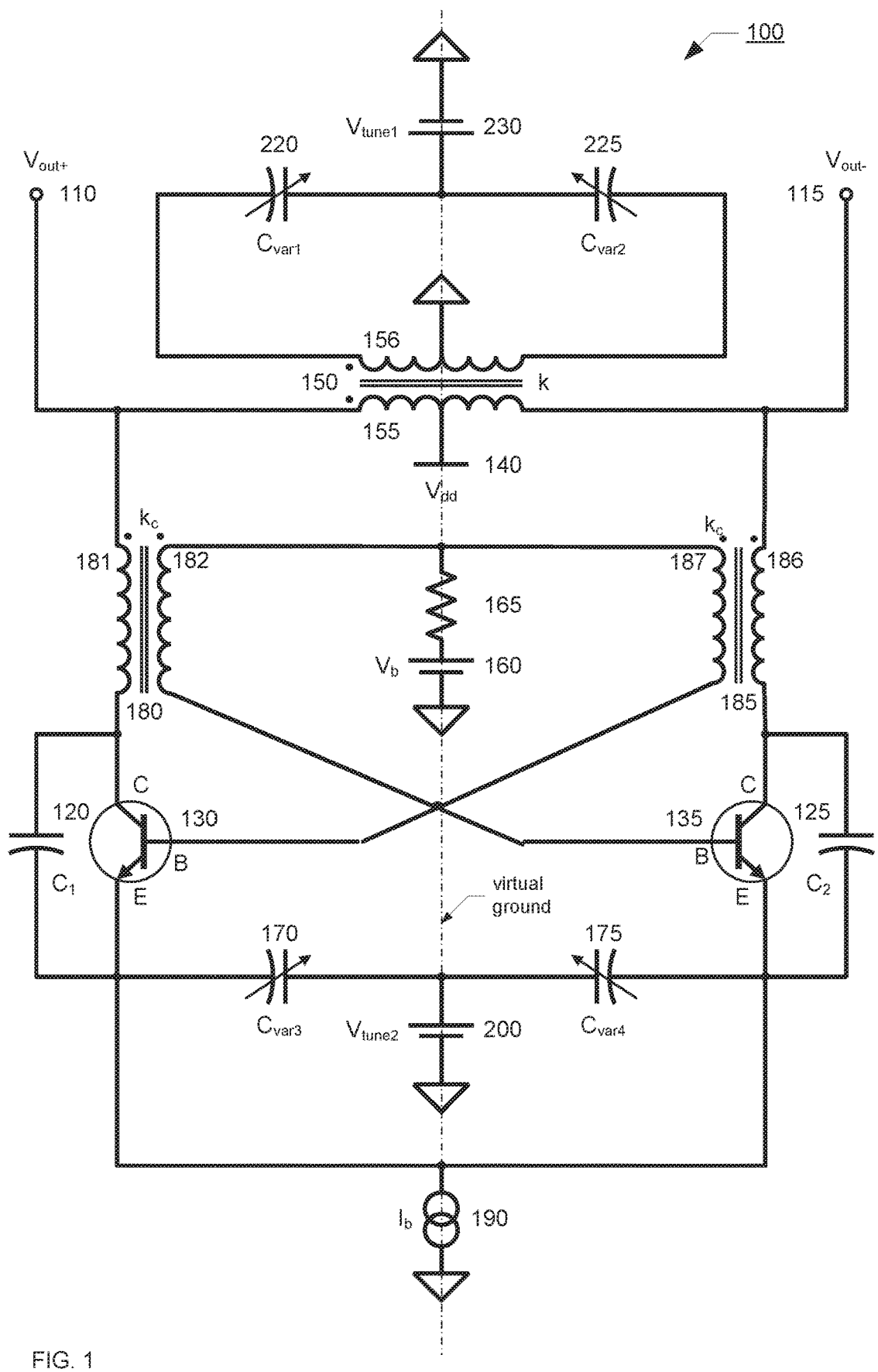
FIG. 1 schematically illustrates a circuit diagram for showing the configuration of an Gm-boosted differential Colpitts voltage-controlled oscillator (VCO) based on bipolar transistors with the coupling transformers according to an example of the present invention.

Embodiments of the present disclosure will be described below in detail with reference to drawings. Note that the same reference numerals are used to represent identical or equivalent elements in figures, and the description thereof will not be repeated. The embodiments set forth below represent the necessary information to enable those skilled in the art to practice the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

With reference to FIG. 1, a schematic circuit diagram for showing a configuration of an Gm-boosted differential voltage-controlled oscillator (VCO) according to an example of the present invention is illustrated. The differential VCO 100 is a Colpitts VCO and takes the form of a differential VCO circuit with positive and negative output terminals $V_{out+}$ 110 and $V_{out-}$ 115. It should be noted that in the context of this specification, a differential signal may comprise two components having the same amplitude and opposite phase. A differential signal may be provided via two terminals.

The differential VCO comprises two active devices, in this case first transistor 130 and second transistor 135. Any kind of transistor or suitable active device may be used. The active devices respectively transistors 130 and 135 may be identical in respect to their properties to provide symmetrical active devices. In particular, the two active devices are bipolar transistors 130 and 135; more particularly, the two active devices are bipolar junction transistors 130 and 135. It may be contemplated to use transistors suitable for high frequencies for or as active devices, in particular NPN-transistors. The positive and negative output terminals $V_{out+}$ 110 and $V_{out-}$ 115 are coupled to the collectors of the respective one of the transistors 130 and 135.

In the illustrated configuration, the bipolar transistors 130 and 135 form a balanced differential pair of bipolar transistors 130 and 135. Capacitors 120 and 125 are coupled in parallel to the collector-emitter path of transistors 130 and 135. The capacitor 120 and the capacitor 125 form feedback capacitors, each of which being connected to the collector and the emitter of a respective one of the transistors 130 and 135. The capacitors 120 and 125 provide a positive feedback from the emitter to the collector of the respective one of the transistors 130 and 135. It is feasible to choose the capacitances of capacitors 120 and 125 to be equal.

A coil 155 biased at a supply voltage $V_{dd}$ 140 is coupled to the collectors of the transistors 130 and 135 such that the collectors of the transistors 130 and 135 are coupled to each other via the coil 155. The collectors of the transistors 130 and 135 are coupled to a respective one of the end taps of the coil 155. In an example, a supply voltage $V_{dd}$ 140 is supplied to the coil 155; in particular the supply voltage $V_{dd}$ 140 is supplied to a center tap of the coil 155. For instance, the supply voltage $V_{dd}$ may be 2.5 V, or lower, or higher (e.g. 3.3 V or 5 V).

The emitters of the transistors 130 and 135 are further connected via varactors 170 and 175, respectively, to a common reference ground. The capacitances of the varactors 170 and 175 are tunable by a tuning voltage $V_{tune2}$ provided by a tuning voltage source 200 to supply the interconnection common net of the varactors 170 and 175. The tuning voltage $V_{tune2}$ is provided by a direct voltage source or in form of a current mirrored voltage, e.g. provided by a current mirror circuit. It is feasible to choose the capacitances of varactors 170 and 175 to be equal. The varactors 170 and 175 may have an essentially identical capacitance dependency to a changing tuning voltage $V_{tune2}$ over a suitable tuning voltage range. In the illustrated configuration, the varactors 170 and 175 are inserted in series between the emitters of the transistors 130 and 135. The capacitance tuning of the varactors 170 and 175 is obtained by a single-ended tuning voltage $V_{tune2}$ control.

In the differential VCO, a bias current source 190 provides a bias current $I_b$ for the transistor 130 and the transistor 135, respectively. The bias current source 190 may provide direct bias current $I_b$. In an example, the bias current source 190 is inserted between the emitters of the transistor 130 and 135 and the lowest reference potential such as ground potential. In an example, the emitters of both transistors 130 and 135 are connected together via an interconnection, between which and the lowest reference potential the bias current source 190 is inserted.

The coil 155 is a primary (or main) coil 155 of a transformer 150 comprising a secondary coil 156 inductively coupled with the primary coil 155. The secondary coil 156 is connected in series to varactors 220 and 225, which capacitances are tunable by a tuning voltage $V_{tune1}$ provided by a tuning voltage source 230 to a common interconnection net the varactors 220 and 225. The tuning voltage $V_{tune1}$ is provided by a direct voltage source or in form of a current mirrored voltage, e.g. provided by a current mirror circuit. The capacitance tuning of the varactors 220 and 225 is enabled by a single-ended tuning voltage $V_{tune1}$ control. It is feasible to choose the capacitances of varactors 220 and 225 to be equal. The varactors 220 and 225 may change the capacitance in response to a changing tuning voltage $V_{tune1}$ over a suitable tuning voltage range. In the illustrated configuration, the varactors 220 and 225 are connected in series with a respective one of the end taps of the secondary coil 156. The center tap of the secondary coil 156 is supplied to lowest reference potential. In particular, a center tap of the secondary coil 156 is set to lowest reference potential such as ground, in order to achieve a maximal tuning range within a given supply.

The main frequency tuning of the differential VCO is enabled by the transformer coupled varactor pair 220 and 225. The transformer coupled pair of varactors 220 and 225 enables a wide-range tuning of the oscillator frequency, e.g. a tuning of the oscillator frequency in the W-band. For instance, the transformer coupled pair of varactors 220 and 225 enables a tuning of the oscillator frequency in a frequency range, which comprises the LRR frequency range (76-77 GHz) and the SRR frequency range (77-81 GHz). For instance, the transformer coupled pair of varactors 220 and 225 enables a tuning of the oscillator frequency in a frequency range, which comprises 57-64 GHz band of the IEEE 802.15.TG3c WPAN communications. The frequency tuning range of the differential VCO is further expanded by the emitter side arranged varactor pair 170 and 175, which enables not only a wide tuning range for e.g. LRR and SRR application, but also in particular can be used for the compensation of the oscillation frequency drift due to process, supply and temperature variation (PVT).

The base terminals and the collector terminals of the transistors 130 and 135 are cross-coupled using coupling transformers 180 and 185 having a coupling factor $k_c$. Each of the couplers 180 and 185 comprises of a primary (or main) coil 181 and 186, respectively, and a secondary (or coupling) coil 182 and 187, respectively. The primary coil 181 and 186, respectively, forms a main (or primary) path and the secondary coil 182 and 187, respectively, forms a coupling (or secondary) path. Each of the coupling transformers 180 and 185 couples a defined amount of the electromagnetic power of a main signal on the main path into a coupling signal on the coupling path. The defined amount is represented by the coupling factor $k_c$. The main path of the couplers 180 and 185, respectively, is connected in series between a respective one of the collector terminals of the transistors 130 and 135 and a respective one of the end taps of the primary coil 155. The coupling paths of the couplers 180 and 185 are cross-coupled to the base terminals of the transistors 130 and 135. The coupler 180, which main path is coupled to the collector terminal of transistor 130, is coupled via its coupling path to the base terminal of the transistor 135 and the coupler 185, which main path is coupled to the collector terminal of transistor 135, is coupled via its coupling path to the base terminal of the transistor 130. Hence, the coupled signal on the coupling signal side of one of the couplers 180 and 185 coupled to the collector terminal of the respective one of the transistors 130 and 135 is cross-coupled to the base terminal of the respective other one of the transistors 130 and 135.

In an example, a common basing voltage $V_{bias}$ is further supplied to base terminals of the transistors 130 and 135. For instance, a biasing voltage source 160 is inserted between lowest reference potential (such as ground) and the couplers 180 and 185. In particular, the biasing voltage source 160 is inserted between lowest reference potential and a common interconnection net of the coupling path of the couplers 180 and 185 (e.g. the common interconnection net connecting the second end taps of the secondary coils 182 and 187 of the couplers 180 and 185). A bias resistor 165 may be arranged between biasing voltage source 160 and the base terminals of the transistors 130 and 135. In an example, the coupling paths of the couplers 180 and 185 are arranged in a series circuit cross-coupling the base terminals of the transistors 130 and 135.

The couplers 180 and 185, which are arranged to cross-couple the collector terminals and base terminals of the transistors 130 and 135 provide for differential signals present at the collector terminals of the transistors 130 and 135 being coupled to the base terminals of the respective other one of the transistors 130 and 135, which effectively modifies the effective transconductance by a factor 1+A, wherein $A=k_c(1+C_1/C_{var3})$, wherein $k_c$ is the coupling factor of the coupler 180, $C_1$ is the capacitance of the capacitor 120 and $C_{var3}$ is the capacitance of the varactor 170. As a consequence, the start-up behavior of the differential VOC is effectively improved in that less biasing current is required. A reduction of the biasing current has further the effect of less channel noise originating from the pair of transistors 130 and 135 and lower contribution to the noise.

Moreover, by adjusting the coupling factor $k_c$, an optional charge swing across the current noise source and an optimal RMS (root mean square) value of the effective impulse sensitivity function (ISF) associated with the noise source can be achieved for an optimized phase noise.

The small-signal admittance with respect to the collector of the transistors result to following:

$$R\{Y_{in}\} = -\frac{g_m\omega^2 C_1 C_{var3}\left[1+k_c\left(1+\frac{C_1}{C_{var3}}\right)\right]}{g_m^2 + \omega^2(C_1+C_{var3})^2} = -\frac{g_m\omega^2 C_1 C_{var3}[1+A]}{g_m^2 + \omega^2(C_1+C_{var3})^2}$$

wherein $g_m$ is the collector transconductance of the transistor 130, $C_1$ is the capacitance of the capacitor 120, $C_{var3}$ is the capacitance of the varactor 170, $k_c$ is the coupling factor of the coupler 180 and $\omega$ is the circular frequency of the differential VCO. It should be noted that it is further assumed that the transistors 130 and 135, the capacitors 120 and 125 and the varactors 170 and 175 have the same properties and specifications. This means that the properties and specification of the components of the differential VCO are symmetric with respect to the virtual ground plane.

The factor $1+k_c(1+C_1/C_{var3})$, which is the contribution of the coupler-based cross-coupling, increases the amount of the negative small-signal conductance. The contribution $A=k_c(+C_1/C_{var3})$ may be understood as an Gm-boosting factor.

With respect to FIG. 1, an example of an Gm-boosted differential VCO is illustrated and described, which comprises bipolar transistors 130 and 135 as active devices. In particular, SiGe bipolar transistors 130 and 135 may offer desired high frequency characteristics. However, the implementation of an Gm-boosted differential VCO should not be understood to be limited to bipolar transistors 130 and 135 as active devices. MOS (n-type metal-oxide semiconductor) transistors and in particular NMOS (n-type metal-oxide semiconductor) transistors may be also used as active devices.

Figure 2:
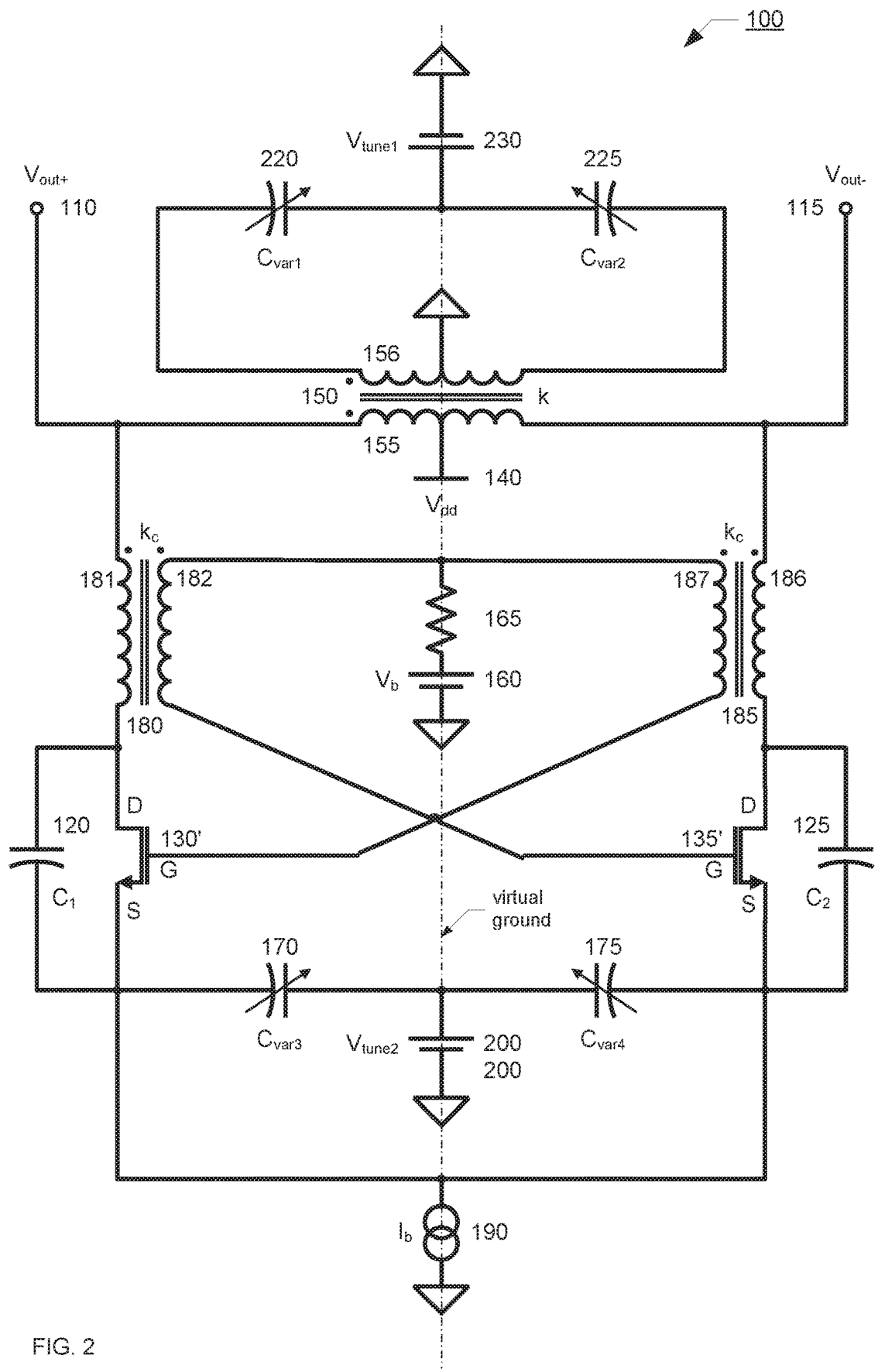
FIG. 2 schematically illustrates a circuit diagram for showing the configuration of an Gm-boosted differential Colpitts VCO based on MOS transistors with the coupling transformers according to another example of the present invention.

Referring now to FIG. 2, a schematic circuit diagram for showing another configuration of an Gm-boosted differential VCO, and in particular an Gm-boosted differential Colpitts VCO, according to an example of the present invention is illustrated. The active devices respectively transistors 130 and 135, which may be identical in respect to their properties to provide symmetrical active devices, are MOS transistors 130' and 135'; more particularly, the two active devices are NMOS transistors 130' and 135' in a balanced configuration. The remaining parts of the circuit substantially correspond to those described with reference to FIG. 1. Hence, the above description essentially applies likewise to the configuration of FIG. 2 provided that the technical terms relating to the terminals of the bipolar transistors 130 and 135 are translated into technical terms relating to the terminals of the MOS transistors 130' and 135'. Those skilled in the art will immediately understand that the terms "collector", "emitter" and "base" used in the context of bipolar transistors translate to the corresponding terms "drain", "source" and "gate" for MOS transistors. Hence, a repetition is omitted.

For the sake of description, the collector terminal and the drain terminal will be also referred to as a first current terminal, the emitter terminal and drain terminal will be also referred to as a second current terminal and the base terminal and gate terminal will be also referred to as a control terminal.

With respect to FIGS. 1 and 2, examples of Gm-boosted differential VCOs are illustrated and described, which comprise coupling transformers for cross-coupling the base/gate terminals and collector/drain terminals of the transistors 130/130' and 135/135'. However, the implementation of an Gm-boosted differential VCO should not be understood to be limited to coupling transformers for cross-coupling.

Figure 3:
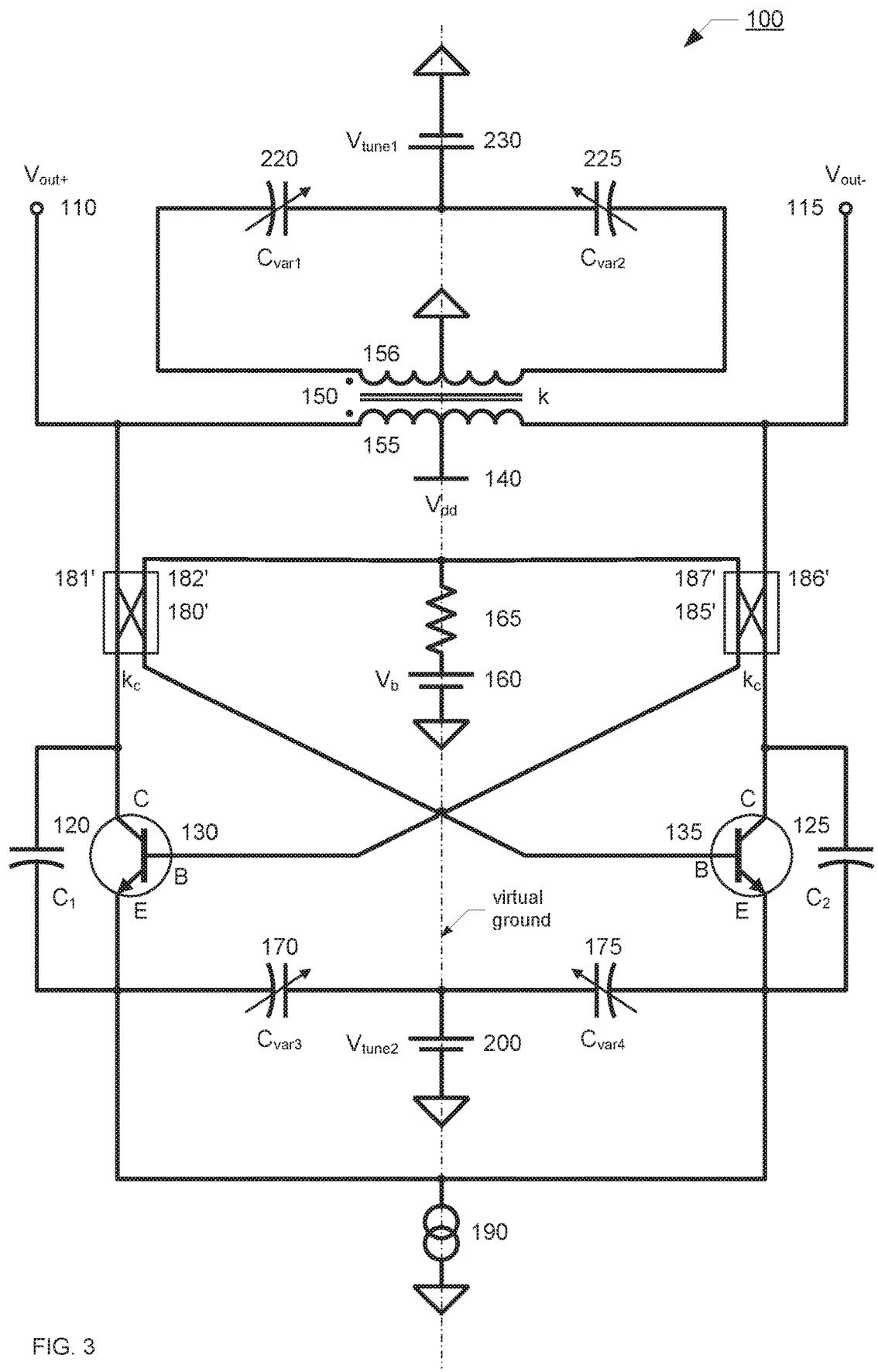
FIG. 3 schematically illustrates a circuit diagram for showing the configuration of an Gm-boosted differential Colpitts voltage-controlled oscillator (VCO) based on bipolar transistors with the transmission line based coupler according to an example of the present invention.
Figure 4:
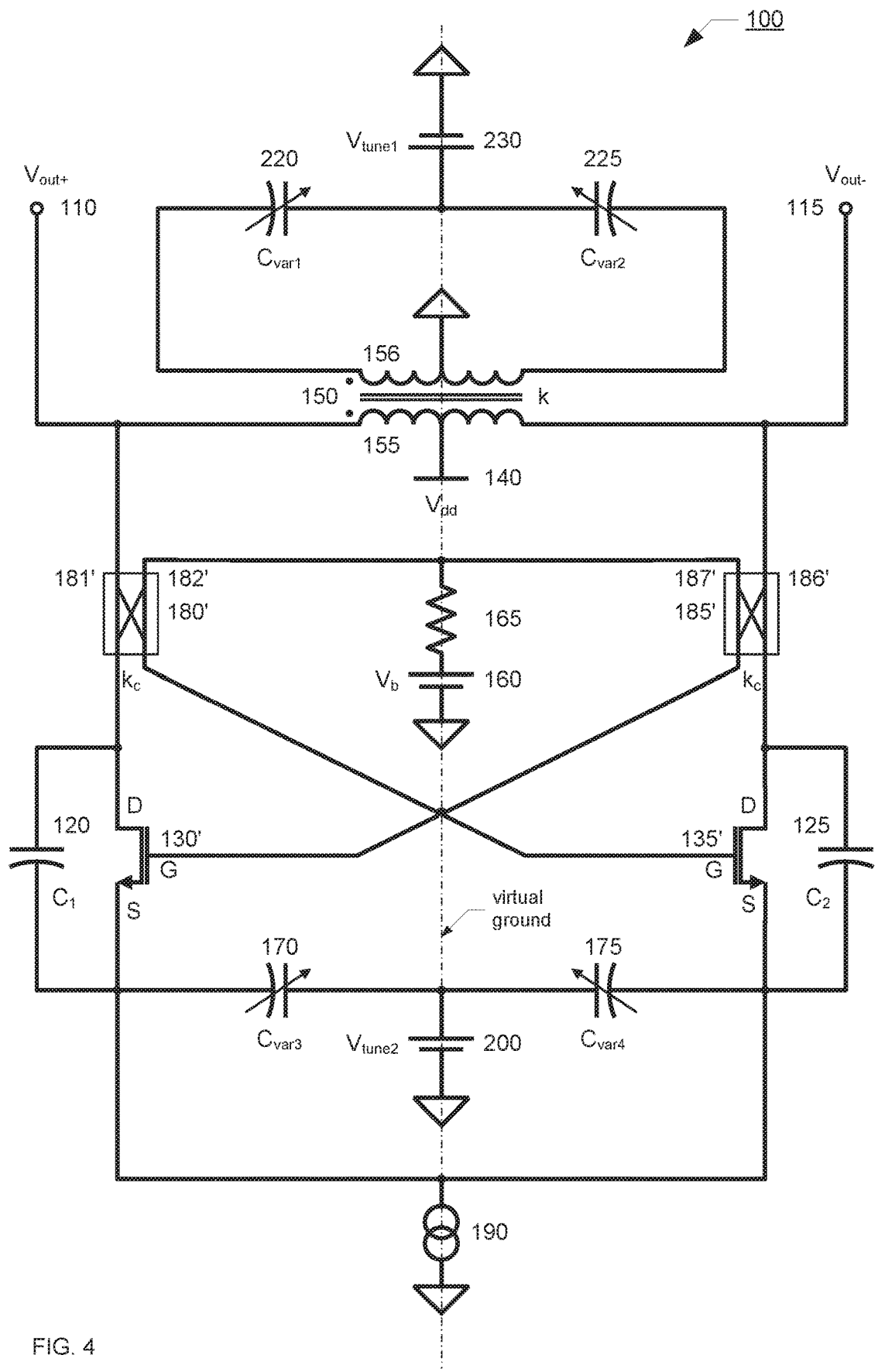
FIG. 4 schematically illustrates a circuit diagram for showing the configuration of an Gm-boosted differential Colpitts VCO based on MOS transistors with the transmission line based coupler according to another example of the present invention.

Referring now to FIGS. 3 and 4, schematic circuit diagrams for showing the configuration of an Gm-boosted differential Colpitts VCOs with the transmission line based coupler according to further examples of the present invention are illustrates. Whereas FIG. 3 schematically illustrates an example of an Gm-boosted differential VCO with bipolar transistors 130 and 135 as active devices, FIG. 4 schematically illustrates an example of an Gm-boosted differential VCO with MOS transistors 130' and 135' as active devices. The above description with reference to FIG. 2 relating to the bipolar transistors 130 and 135 and the MOS transistors 130' and 135' applies likewise. It should be noted that the couplers 180 and 185 will be discussed in the following, since the remaining parts of the circuits substantially corresponds to those described with reference to FIG. 1 and FIG. 2, respectively.

In analogy to FIGS. 1 and 2, the base/gate terminals and the collector/drain terminals of the transistors 130/130' and 135/135' are cross-coupled using coupling transmission line based couplers 180' and 185' having a coupling factor $k_c$.

Each of the couplers 180' and 185' comprises of a primary (or main) transmission line 181' and 186', respectively, and a secondary (or coupling) transmission line 182' and 187', respectively. The primary transmission line 181' and 186', respectively, forms a main (or primary) path and the secondary transmission line 182' and 187', respectively, forms a coupling (or secondary) path. Each of the couplers 180' and 185' couples a defined amount of the electromagnetic power of a main signal on the main path into a coupling signal on the coupling path. The defined amount is represented by the coupling factor $k_c$. The main path of the couplers 180' and 185', respectively, is connected in series between a respective one of the collector/drain terminals of the transistors 130/130' and 135/135' and a respective one of the end taps of the primary coil 155. The coupling paths of the couplers 180' and 185' are cross-coupled to the base/gate terminals of the transistors 130/130' and 135/135'. The coupler 180', which main path is coupled to the collector/drain terminal of transistor 130/130', is coupled via its coupling path to the base/gate terminal of the transistor 135/135' and the coupler 185', which main path is coupled to the collector/drain terminal of transistor 135/135', is coupled via its coupling path to the base/gate terminal of the transistor 130/130'. Hence, the coupled signal on the coupling signal side of one of the couplers 180' and 185' coupled to the collector/drain terminal of the respective one of the transistors 130/130' and 135/135' is cross-coupled to the base/gate terminal of the respective other one of the transistors 130/130' and 135/135'.

In an example, a common basing voltage $V_{bias}$ is further supplied to base/gate terminals of the transistors 130/130' and 135/135'. For instance, a biasing voltage source 160 is inserted between lowest reference potential (such as ground) and the couplers 180' and 185'. In particular, the biasing voltage source 160 is inserted between lowest reference potential and a common interconnection net of the coupling path of the couplers 180' and 185' (e.g. the common interconnection net connecting the secondary transmission line 182' and 187' of the couplers 180' and 185). A bias resistor 165 may be arranged between biasing voltage source 160 and the base/gate terminals of the transistors 130/130' and 135/135'. In an example, the coupling paths of the couplers 180 and 185 are arranged in a series circuit cross-coupling the base/gate terminals of the transistors 130/130' and 135/135'.

The couplers 180' and 185', which are arranged to cross-couple the collector/drain terminals and base/gate terminals of the transistors 130/130' and 135/135', provide for differential coupling signals (decoupled from the main signal at the collector/drain terminals of the transistors 130/130' and 135/135) to the base/gate terminals of the respective other one of the transistors 130/130' and 135/135'. The cross-coupling effectively modifies the effective transconductance by a factor 1+A, wherein $A=k_c(1+C_1/C_{var3})$, $k_c$ is the coupling factor of the coupler 180, $C_1$ is the capacitance of the capacitor 120 and $C_{var3}$ is the capacitance of the varactor 170. As a consequence, the start-up behavior of the differential VOC is effectively improved in that less biasing current is required. A reduction of the biasing current has further the effect of less channel noise originating from the pair of transistors 130/130' and 135/135' and lower contribution to the noise.

Referring now to FIG. 5a to 5d, schematic layouts of the transmission line based couplers applicable with the above described Gm-boosted differential Colpitts VCO according to examples of the present invention are illustrated.

As for instance illustrated in FIGS. 5a and 5b, the couplers 180' and 185' may be implemented by two top metal strips with a common ground plane. In an example illustrated in FIG. 5a, parts of the metal strips are arranged to overlap. The coupling factor $k_c$ is determined among others by the dimensions of the overlapping parts of the two top metal strips. Accordingly, adjusting the coupling factor $k_c$ is obtainable by adjusting the dimensions of the overlapping parts. In a further example illustrated in FIG. 5b, the two metal strips 310 and 315 may be arranged coplanar in a common layer above a common ground plane 330 (separated by an insulator 320). The coupling factor $k_c$ is determined among others by the dimensions and spacing of the two top metal strips. Accordingly, adjusting the coupling factor $k_c$ is obtainable by adjusting the dimensions and spacing of the coplanar arranged metal stripes. The metal stripes may be microstrips.

In a further example, hybrid couplers may be also used for cross-coupling. For instance. FIG. 5c illustrates a coupled-line coupler and FIG. 5d illustrates a branch-line coupler.

The coupled-line coupler is for instance made by two transmission lines. The branch-line coupler is for instance made by two main transmission lines shunt-connected by two secondary branch transmission lines. The couplers have a symmetrical four port layout. First port is named as input port, second and third ports are Output ports and the fourth port is the isolated port. The second port is also named as direct or through port and the third port is named as coupled port. In an example, the coupled port is used for cross-coupling the collector/drain terminals of one of the transistors 130/130' and 135/135' to the base/gate terminals of the respective other one of the transistors 130/130' and 135/135'. The isolated port is used for coupling the couplers 180' and 185' via the common interconnection net, into which the common basing voltage $V_{bias}$ may be fed.

It should be noted that the present invention is not limited to the above described exemplary couplers. In fact, any kind of signal coupling device, which couples portion of signal power from the main path into a secondary path, may be used with an embodiment of an Gm-boosted differential VCO according to the present invention.

According to an example of the present application, a differential VCO circuit is provided, which comprises a pair of transistors with control terminals biased by a common biasing voltage and a pair of couplers arranged to cross-couple first current terminals and the control terminals of the pair of transistors. The pair of couplers have a coupling factor $k_c$.

In an example, each of the pair of couplers comprises a main path and a coupling path. A first one of the pair of couplers is coupled via the main path to one of the pair of transistors and via the coupling path to the other one of the pair of transistors. A second one of the pair of couplers is coupled via the main path to the other one of the pair of transistors and via the coupling path to the one of the pair of transistors.

In an example, the coupling paths of the pair of couplers are connected via an interconnection to each other. The coupling paths of the pair of couplers form a series circuit coupling the control terminals of the pair of transistors.

In an example, the common biasing voltage is fed into the interconnection.

In an example, the circuit further comprises a biasing voltage source arranged to supply the common biasing voltage via a bias resistor.

In an example, the pair of couplers is one of a pair of coupling transformer and a pair of transmission line based couplers.

In an example, the circuit further comprises a differential transformer with a primary coil inserted between first current terminals of the transistors and a secondary coil coupled in a closed series circuit with two varactors, which are arranged for being tuned by a first common tuning voltage. The circuit further comprises a series circuit comprising two further varactors coupled in series to second current terminals of the transistors. The two further varactors are arranged for being tuned by a second common tuning voltage.

In an example, the circuit further comprises feedback capacitors, each of which coupled between the first current terminals and second current terminals of a respective one of the transistors.

In an example, the circuit further comprises a bias current source coupled between the second current terminals of the pair of transistors and reference potential.

In an example, the circuit is a Colpitts differential voltage controller oscillator.

In an example, the primary coil has a center tap, which is arranged to receive a supply voltage. The secondary coil has a center tap, which is coupled to reference potential.

In an example, the transistors are bipolar transistors. The first current terminal is a collector terminal, the second current terminal is an emitter terminal and the control terminal is a base terminal.

In an example, the transistors are MOS transistors. The first current terminal is a drain terminal, the second current terminal is a source terminal and the control terminal is a gate terminal.

In an example, the circuit further comprises a first tuning voltage source coupled to an interconnection of the two varactors and arranged to supply the first common tuning voltage.

In an example, the circuit further comprises a second tuning voltage source coupled to an interconnection of the two further varactors and arranged to supply the second common tuning voltage.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

The connections or couplings as discussed herein may be any type of connection or coupling suitable to transfer signals from or to the respective nodes, units or devices, for example via intermediate devices. The terms coupling and connection, respectively coupled and connected, may be used interchangeably. Accordingly, unless implied or stated otherwise, the connections may for example be direct connections or indirect connections. The connections may be illustrated or described in reference to be a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as differential positive or negative analog signal. In the case of a negative analog signal, the signal is relative than the common-mode DC signal, which corresponds to an analog ground level zero. In the case of a positive analog signal, the signal higher than the common-mode DC signal. Note that any of the differential signals described herein can be designed as either negative or positive signals.

Those skilled in the art will recognize that the boundaries between functional blocks are merely illustrative and that alternative embodiments may merge functional blocks or circuit elements or impose an alternate decomposition of functionality upon various blocks or circuit elements. Thus, it is to be understood that the architectures depicted herein are merely exemplary, and that in fact many other architectures can be implemented which achieve the same functionality. For example, an inductive coil and a resistor may be integrated into one element.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also, the illustrated examples may be implemented as circuitry located on a single integrated circuit or within a same device, in an embodiment. For example, all the components of the oscillator circuit may be integrated on one substrate. Alternatively, the examples may be implemented as any number of separate integrated circuits or separate devices interconnected with each other in a suitable manner. For example, one or more than one of the output branches may be provided partially or completely on a substrate different from the substrate the oscillator core is provided on.

Also, the examples, the embodiments, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as "computer systems".

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word "comprising" does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A differential voltage controlled oscillator (VCO) circuit, comprising:
a pair of differential transistors with control terminals biased by a common biasing voltage;
a pair of couplers arranged to cross-couple first current terminals and the control terminals of the pair of differential transistors, wherein the pair of couplers have a coupling factor;
a differential transformer with a primary coil inserted between the first current terminals of the pair of differential transistors and a secondary coil coupled in a closed series circuit with two varactors, which are arranged for being tuned by a first common tuning voltage; and
a series circuit comprising two further varactors coupled in series to second current terminals of the pair of differential transistors, wherein the two further varactors are arranged for being tuned by a second common tuning voltage.

2. The circuit according to claim 1, wherein:
each of the pair of couplers comprises a main path and a coupling path;
a first one of the pair of couplers is coupled via the main path to one of the pair of differential transistors and via the coupling path to the other one of the pair of differential transistors; and
a second one of the pair of couplers is coupled via the main path to the other one of the pair of differential transistors and via the coupling path to the one of the pair of differential transistors.

3. The circuit according to claim 2, wherein:
the coupling paths of the pair of couplers are connected via an interconnection to each other, and
the coupling paths of the pair of couplers form a series circuit coupling the control terminals of the pair of differential transistors.

4. The circuit according to claim 3, wherein the common biasing voltage is fed into the interconnection.

5. The circuit according to claim 1, further comprising:
a biasing voltage source arranged to supply the common biasing voltage via a bias resistor.

6. The circuit according to claim 1, wherein:
the pair of couplers comprises a pair of transmission line based couplers.

7. The circuit according to claim 1, further comprising:
feedback capacitors, each of which coupled between the first current terminals and the second current terminals of a respective one of the pair of differential transistors.

8. The circuit according to claim 1, further comprising:
a bias current source coupled between the second current terminals of the pair of differential transistors and a reference potential.

9. The circuit according to claim 1, wherein:
the primary coil has a center tap, which is arranged to receive a supply voltage;
and the secondary coil has a center tap, which is coupled to a reference potential.

10. The circuit according to claim 1, wherein:
the pair of differential transistors are bipolar transistors, wherein the first current terminals are collector terminals, the second current terminals are emitter terminals, and the control terminals are base terminals.

11. The circuit according to claim 1, wherein:
the pair of differential transistors are metal-oxide semiconductor, MOS, transistors, wherein the first current terminals are drain terminals, the second current terminals are source terminals, and the control terminals are gate terminals.

12. The circuit according to claim 1, further comprising:
a first tuning voltage source coupled to an interconnection of the two varactors and arranged to supply the first common tuning voltage.

13. The circuit according to claim 12, further comprising:
a second tuning voltage source coupled to an interconnection of the two further varactors and arranged to supply the second common tuning voltage.

14. A differential voltage controlled oscillator (VCO) circuit, comprising:
a pair of differential transistors with control terminals coupled to receive a common biasing voltage;
a pair of couplers arranged to cross-couple first current terminals and the control terminals of the pair of differential transistors, each of the pair of couplers comprises a main path and a coupling path;
a differential transformer with a primary coil inserted between the first current terminals of the pair of differential transistors and a secondary coil coupled in a closed series circuit with two varactors, which are arranged for being tuned by a first common tuning voltage; and
a series circuit comprising two further varactors coupled in series to second current terminals of the pair of differential transistors, wherein the two further varactors are arranged for being tuned by a second common tuning voltage.

15. The circuit according claim 14, further comprising:
a biasing voltage source configured and arranged to supply the common biasing voltage by way of a bias resistor.

16. The circuit according to claim 14, wherein:
a first one of the pair of couplers is coupled via the main path to one of the pair of differential transistors and via the coupling path to the other one of the pair of transistors, and
a second one of the pair of couplers is coupled via the main path to the other one of the pair of differential transistors and via the coupling path to the one of the pair of differential transistors.

17. The circuit according claim 14, further comprising:
a bias current source configured and arranged to provide a bias current for the pair of differential transistors, the bias current source coupled between the second current terminals of the pair of differential transistors and a reference potential.

18. The circuit according to claim 14, further comprising:
a first tuning voltage source coupled to an interconnection of the two varactors and arranged to supply the first common tuning voltage; and
a second tuning voltage source coupled to an interconnection of the two further varactors and arranged to supply the second common tuning voltage.

* * * * *